United States Patent [19]

Wu

[11] Patent Number: 5,887,324
[45] Date of Patent: Mar. 30, 1999

[54] ELECTRICAL TERMINAL WITH INTEGRAL CAPACITIVE FILTER

[75] Inventor: Jeff Cherng-chou Wu, Clemmons, N.C.

[73] Assignee: The Whitaker Corporation, Wilmington, Del.

[21] Appl. No.: 705,934

[22] Filed: Aug. 30, 1996

[51] Int. Cl.⁶ .................................................. H01G 7/00
[52] U.S. Cl. .................... 29/25.42; 29/25.03; 29/825; 29/830; 29/874; 361/303; 361/321.4; 361/328; 429/596
[58] Field of Search .................... 219/121.35, 121.64, 219/761; 333/182, 184, 185; 361/321.4, 321.5, 302, 309, 314, 312, 329; 438/535; 439/607, 608, 620; 429/556, 596; 29/25.3, 25.42, 825, 830, 872, 873, 874

[56] References Cited

U.S. PATENT DOCUMENTS

| | | | |
|---|---|---|---|
| 4,020,430 | 4/1977 | Vander Heyden | 333/183 |
| 4,682,129 | 7/1987 | Bakermans et al. | 333/184 |
| 4,870,538 | 9/1989 | Baldwin et al. | 29/25.42 |
| 4,877,644 | 10/1989 | Wu et al. | 427/556 |
| 4,931,754 | 6/1990 | Moussie | 333/184 |
| 5,049,405 | 9/1991 | Cheung | 427/596 |
| 5,155,325 | 10/1992 | McCleaf et al. | 219/121.64 |
| 5,394,295 | 2/1995 | Galvagni et al. | 361/303 |
| 5,411,772 | 5/1995 | Cheung | 427/586 |
| 5,471,364 | 11/1995 | Summerfelt et al. | 361/321.4 |
| 5,577,309 | 11/1996 | Frank et al. | 29/25.42 |
| 5,701,647 | 12/1997 | Saenger et al. | 29/25.42 |

FOREIGN PATENT DOCUMENTS

| | | | |
|---|---|---|---|
| 60116215 | 6/1985 | European Pat. Off. | H03H 7/01 |
| 0 385 259 A1 | 9/1990 | European Pat. Off. | H01R 13/719 |
| 05267570 | 10/1993 | European Pat. Off. | H01L 27/04 |
| 60-116215 A | 6/1985 | Japan | H03H 7/01 |
| 5-267570 | 10/1993 | Japan | H01L 27/04 |
| 2 248 072 | 3/1992 | United Kingdom | C23C 14/12 |

OTHER PUBLICATIONS

International Search Report, Applicant's Reference No. 16667 PCT, International Application No. PCT/US 97/14845, International Filing Date: 30 Aug. 1996.

Pulsed Laser Deposition of BaTio(3), Sato et al., Supercond. Sci Technol. 9 (1996), Printed in UK.

Polycrystallization of Pulsed Laser Deposited BaTio(3) Thin Films at Room Temperature by KrF Laser Annealing, Tomita et al., Conference. Proceedings of IEEE Lasers and Electro–Optics Society, Oct. 30–31, 1995.

Primary Examiner—W. Donald Bray
Attorney, Agent, or Firm—Bradley N. Ditty

[57] ABSTRACT

A process for fabricating an electrical terminal (48) having an integral capacitor (50) formed on the exterior of the terminal includes a laser ablation process for deposition of a thin layer of dielectric material (44) on to the body of the terminal (48). An outer electrode (46) is then deposited on the exterior of the dielectric layer and the terminal can be used in a filtered electrical connector. A wire (2) can be cleaned by, for example, a plasma cleaning step prior to the deposition of the dielectric layer (44) by laser ablation and lasers (12) can be used to anneal at least the outer portion of the additively deposed dielectric layer (44). The wire (2) can be rotated to provide complete coverage.

25 Claims, 2 Drawing Sheets

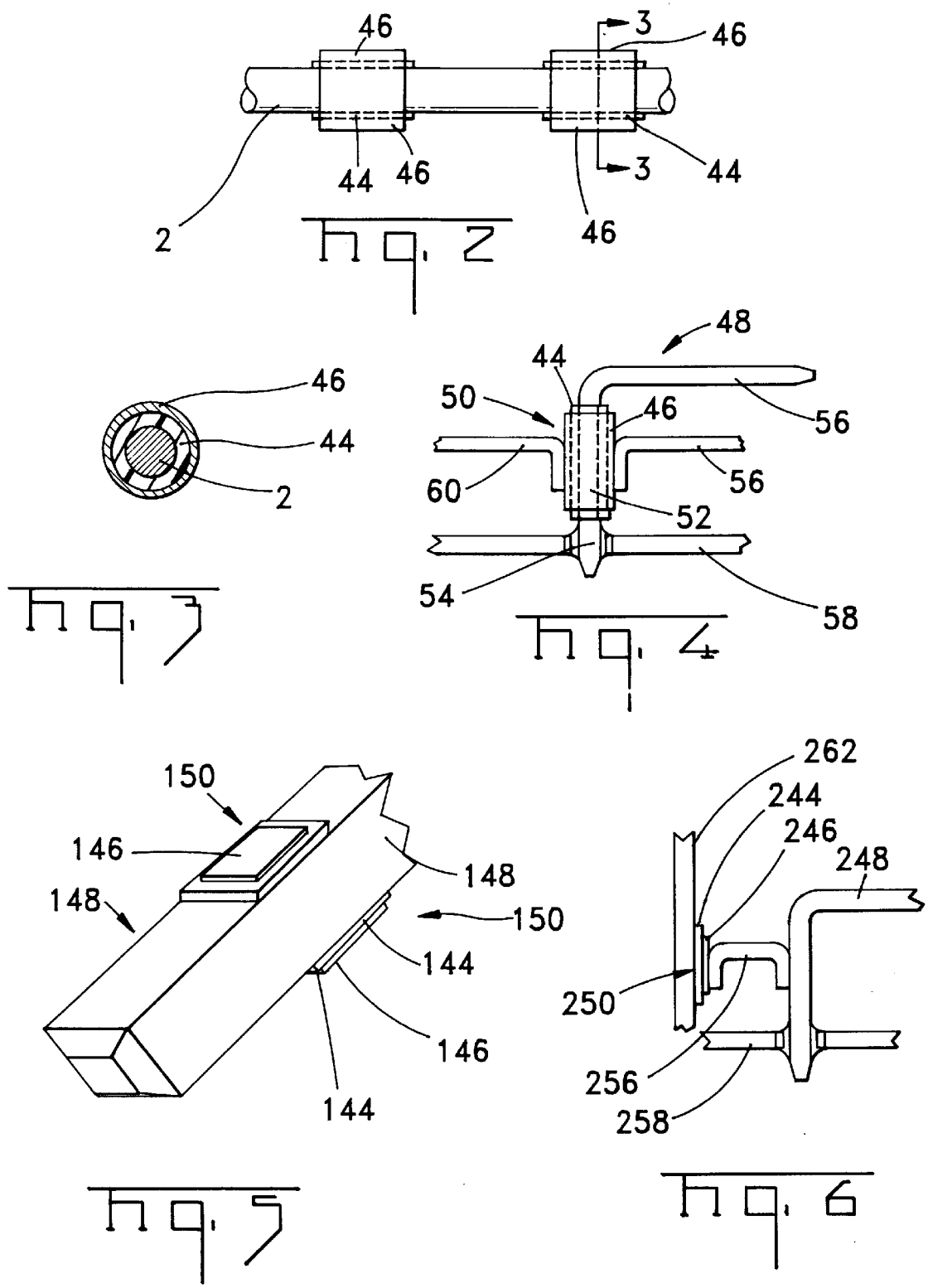

ELECTRICAL TERMINAL WITH INTEGRAL CAPACITIVE FILTER

BACKGROUND OF THE INVENTION

1. Field of the Invention

This invention is related to laser deposition or laser ablation of dielectric material on metallic substrates, especially to deposit a capacitive filter. This invention is also related to the use of capacitive filters in electrical systems and more particularly to the use of electrical connectors containing capacitive filters.

2. Description of the Prior Art

Filtered and shielded electrical connectors are commonly used to control electromagnetic interference (EMI) and radio frequency interference (RFI) in electronic circuits used in noisy environments. Susceptibility to external EMI must be limited both for the electronic systems to function properly and mandatory limits are also imposed for certain applications. Filter connectors are also used to prevent unwanted emissions from noisy circuits to the surrounding environment.

Perhaps the most common method of dealing with these problems is to introduce lumped filter components on printed circuit boards used in these electronic devices. Since filtering requirements are often determined only during testing and often after products are designed and produced, this approach typically means that printed circuit boards must be redesigned. In some applications printed circuit board real estate is limited and this requirement can cause other complications. Even where printed circuit board real estate is available, this band aid approach can cause significant delays. Even minor changes, such as the addition of one or more capacitors, can cause significant problems in applications using complex multilayer printed circuit boards. For these and other reasons, filtered electrical connectors provide a desirable alternative.

One common method for including filtering in electrical connectors is to mount an auxiliary printed circuit board subassembly, including capacitors and possibly other filtering components, on the connector. These auxiliary printed circuit boards are commonly designed for specific filtering applications. The filtered connectors provide probably the best way to address EMI problems because the connectors are generally located at input and output ports of electronic modules or components.

Typically these filter subassemblies are incorporated either in new connectors especially designed for the specific applications or in conventional electrical connectors, especially modified for filtering applications. This is especially true in automotive applications. However, not all applications have the same filtering requirements or the same connector configuration, thus limiting the economic advantage that can otherwise be realized by using standard commercially available connectors. Even in applications in which standard electrical connectors can be used, it has been common practice to provide filtering for all lines, even where noise is only a problem on certain lines. Subassemblies that add filtering to all lines are also inconsistent with applications in which some lines or individual circuits are ground rather than signal lines.

Surface mounted chip capacitors are currently used in may filtered applications. Dielectric material is screened onto a disposable surface to make surface mount chip capacitors. The screened material is then subjected to a drying and sintering process before the electrodes are plated. The high temperature sintering process precludes the use of low temperature substrates, such as copper and copper alloys, which are conventionally used for electrical contact terminals. One method of using standard surface mount chip capacitors for adding filtering to an electrical connector is to mount standard surface mount capacitors on a printed circuit board or other member. The printed circuit board is then mounted to the connector, typically at the rear of a connector, such as a pin header. and the capacitors are connected between the corresponding pin and a ground member, such as a metal shield. Another approach, represented by U.S. Pat. No. 4,682,129, is to form the capacitors on the substrate using a common technique, such as screen printing, to form conductive layers, or electrodes, as well as an intervening dielectric layer. Barium titanate is used to form the dielectric layer in that patent.

Barium titanate has also been suggested as a material to form a dielectric layer in field effect semiconductors in dynamic random access memory devices and for use in devices in super-conducting electronics. Laser deposition or laser ablation has been suggested as one method of forming the dielectric thin films for use in those applications.

SUMMARY OF THE INVENTION

For many applications, the most significant disadvantage of prior art filtered connectors is that they are not cost effective because of the additional components and assembly steps that are required. The paramount objective of the instant invention is to provide a cost effective way in which filtering can be added to an electrical connector. One way in which the instant invention can address this problem is to employ a drop-in replacement part which can be used to provide filtering on affected lines or circuits without changes to the rest of the connector. In that way, standard electrical connectors that can be cost effectively produced in volume, can be used where the number of applications requiring a specific filter configuration do not otherwise present the possibility of reducing costs by volume production. Additional capital costs can be avoided in this manner.

Another objective of the present invention is to fabricate a capacitor on a metallic substrate, and preferably on a filamentary substrate such as a wire, in a way in which the metallurgy and structure of the substrate is not changed. In this way the substrate can be fabricated from materials that are conventionally used for electrical terminals. To achieve this objective a deposition process that can be carried out at relative low temperature is desirable.

One other objective of this invention is to provide a process that can be adapted to cost effective manufacturing operations. Implicit in the objective is to provide a means for depositing a dielectric layer on a wire or other substrate as rapidly as possible. One way of achieving this objective is to use relatively thin films for the capacitive layer. Defects in the layer and in the stoichiometry of the dielectric material therefore need to be avoided.

The disadvantages of the prior art can be overcome and these and other objectives can be achieved by fabricating an integral capacitor on an electrical terminal or other electrically conductive part of an electrical connector. The preferred method of forming an integral capacitor is to use a laser to vaporize the dielectric material source and to deposit that dielectric material onto the terminal or electrically conductive member. An outer electrode can then be formed on the outer surface of the dielectric layer. The body of the terminal and the outer electrodes will then form the electrodes for the integral capacitor. Laser ablation is the preferred method of depositing the dielectric layer. Although laser ablation can be used to yield a uniform dielectric layer, a laser annealing step preferably follows the laser ablation step so that at least a portion of the dielectric layer can be crystallized.

The terminal including the integral capacitor can be positioned in an electrical connector and then connected to ground to introduce filtering into the connector. Alternatively, integral capacitors can be formed on a ground member with preformed circuits, such as a shield, and a terminal on the circuit to be filtered can be connected to ground through this integral capacitor.

A terminal with an integral capacitor will also include an input and an output contact section. Typically these contact sections will be located at opposite ends of the terminal with the integral capacitor located between the contacts. The input and output contact sections of the terminal can be plated in a conventional manner.

BRIEF DESCRIPTION OF THE DRAWINGS

FIG. 2 is a view of a short section of a continuous wire with discrete capacitors including a laser deposited dielectric layer and an outer electrode.

FIG. 3 is a section view taken along Section 3—3 of FIG. 2 showing the layers of an integral capacitor located on a terminal pin.

FIG. 4 is a view of a terminal pin including an integral capacitive filter section connected to ground by a separate contact member.

FIG. 5 is an isometric view of an alternative embodiment of a terminal pin having a square cross section with an integral capacitor located on opposite surfaces of the pin.

FIG. 6 is a view of a second alternative embodiment in which the integral capacitive filter section is formed on the ground member which is in turn connected to a standard contact pin.

DETAILED DESCRIPTION OF THE PREFERRED EMBODIMENTS

Figure 1:
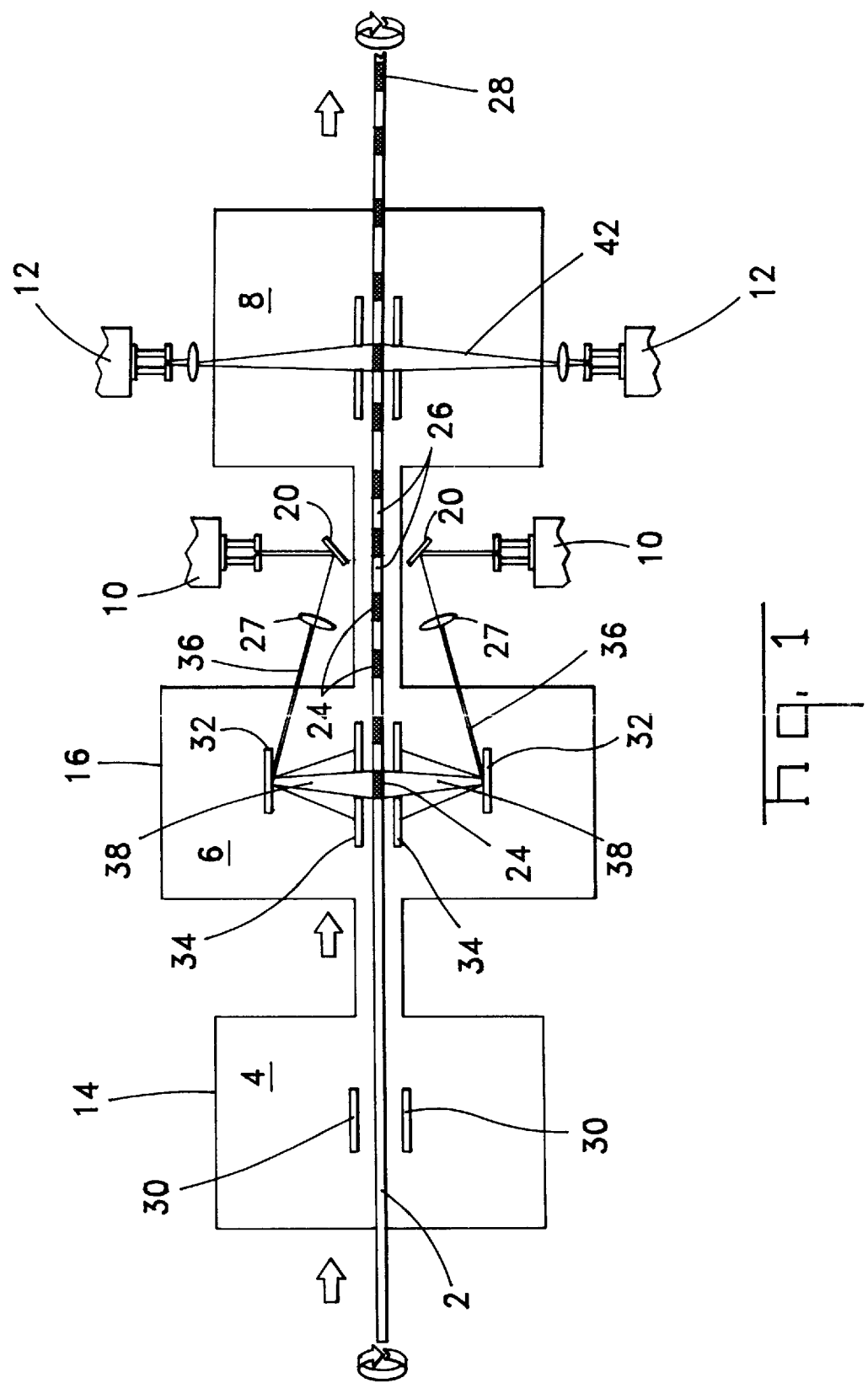
FIG. 1 is a schematic view showing laser ablation and laser annealing steps used to deposit a dielectric layer on discrete sections of a continuous wire to be subsequently used to form terminal pins with integral capacitors.

A preferred method of forming an integral capacitor on a terminal to be used in an electrical connector includes the steps represented in FIG. 1. In this figure a continuous wire 2 is sequentially advanced through a plasma cleaning station 4, a laser ablation station 6, and a laser annealing station 8. After a dielectric layer is deposited on segments of the wire in the laser ablation station 6 and the dielectric layer is at least partially annealed in laser annealing station 8, an electrically conductive electrode is deposited on top of the dielectric layer and the individual terminals are formed by severing the continuous wire 2 and then forming the severed segments as electrical contact terminals, such as those represented by pin terminals 48 shown in FIG. 4. These last two steps are conventional and are not shown in FIG. 1. If necessary, an environmental protective layer covering exposed dielectric material can be added by conventional means.

In the preferred method of implementing this invention, lasers 10 are used to deposit a layer of dielectric material on the wire 2 and lasers 12 are used to anneal the dielectric layer. However, the first step in this process is a cleaning step in which oxides and contaminants are removed from the wire 2. In the preferred embodiment a plasma cleaning method is used, whereby plasma electrodes 30 positioned within a vessel or envelope 14 are used to clean wire 2 as it is advanced through this station. The plasma is generated by electrodes 30, and a cleaned wire 22 emerges. Removal of these surface contaminants promotes satisfactory adherence of a deposited dielectric layer on the wire surface. As an alternative cleaning method, lasers or ion beams can be used to clean the wire 22.

After the wire 2 has been cleaned, it is advanced to the laser ablation station 6 where the wire 2 enters the ablation station envelope 16. In the preferred embodiment of this invention, the envelope comprises a vacuum chamber. The preferred method of depositing a dielectric layer on wire 2 is to use lasers 10 to ablate a dielectric layer on sources 32. A pulsed ultraviolet laser can be used. Preferably an excimer laser is employed. A dielectric plume 38 of dielectric material ablated from source 32 is then focused on a precisely defined spot or segment 24 of wire 2. Masks 34, positioned between the source 32 and the cleaned wire 22, block portions of the dielectric plume 38 to define the ablated wire sections 24. Other portions 26 of the wire 2 advance past the location on which dielectric plume 38 is focused during intervals between laser pulses. Laser pulses can be controlled by a shutter or the beams can be turned on and off. No dielectric material is deposited on sections 26 of the wire 2, and it is these uncoated sections 26 that form the input and output contact sections of the terminals to be formed from the wire 2. By varying the interval between laser ablation pulses and by varying the speed at which the wire 2 is advanced through the laser ablation station 6, the length of these unablated sections 26 and the terminal sections to be formed therefrom can be regulated.

Lasers 10 are focused on the source 32 by mirrors 20 and lenses 27. Two lasers are shown here, but in practice the laser beam from one laser can be split and directed to multiple sources. The sources 32 contain dielectric material that, when ablated, form plume 38 so that the material can be deposited on the wire. Sufficient energy can be focused on source 32 so that the material in plume 38 will have sufficient energy for it to be deposited on wire 2 without heating the wire 2 to a temperature that would alter the structure of the wire 2. Thus if a copper or copper alloy wire such as brass, phosphor bronze or beryllium copper, or other materials used to form electrical contact terminals are used, the metallurgical structure of the wire, and the terminal 48 to be fabricated therefrom, will not be adversely affected when the dielectric material is deposited on segments 24.

Numerous dielectric materials can be ablated in this manner and then deposited as thin films. In the preferred embodiment of this invention, barium titanate is employed. Other dielectric materials, such as ferroelectric oxides and materials exhibiting a perovskite crystal structure can be ablated in this manner. Laser ablation is especially useful in controlling the composition of the dielectric material deposited on a substrate such as wire 2. Because the composition that can be deposited by laser ablation is relatively uniform and free from defects, a relatively thin dielectric film, without leakage paths due to defects, is possible.

Generally, the thinner the dielectric film, the faster the process and a faster manufacturing process equates in this case to a more efficient and economical process.

The stoichiometry of the material is generally preserved because the source material is ablated and vaporized by the laser, which is different from the conventional physical vapor deposition process. In physical vapor deposition, low melting temperature components are generally vaporized first. If needed, the ablation process can take place in a controlled environment of such gases as oxygen to make up the stoichiometry lost during the ablation and deposition processes.

After the dielectric has been deposited on spaced wire segments 24 in the laser ablation station, the wire is advanced to the laser annealing station 8. Lasers 12 are focused on the segments 24 and the energy supplied by these lasers can be used to anneal the dielectric layer. Again a single laser can be used. By annealing the dielectric in this manner, a crystalline structure can be formed on the outer layers of the dielectric material while the portion of the layer adjacent to the wire 2 retain its amorphous character. This crystalline structure can improve the electric and mechanical properties of the layer. Leakage of current can be reduced in this manner.

In the preferred embodiment of this invention, the wire 2 has a circular cross section. Wire 2 is rotated as it is passed through the cleaning station 4, the ablation station 6 and the annealing station 8 so that a uniform dielectric layer is deposited to encircle the wire segments 24. Alternatively, the beams from lasers 10 and 12 can be moved relative to the wire 2. Multiple fixed laser beams can also deposit dielectric material uniformly around the wire without rotating the wire.

The thickness of the dielectric materials can be controlled easily since laser ablation is an additive process. Uniform coverage is maintained by rotation of the wire relative to the source and laser. The capacitance value C of a concentric cylinder per unit length is expressed by the following formula:

$$C = \frac{2\pi * 0.0885 \epsilon_r}{(\ln(R_2/R_1))} \; pf/\text{cm}$$

where $\epsilon_r$ is the relative dielectric constant of the material. For air, $\epsilon_r$ is 1, $R_2$ and $R_1$ are the outer and inner radii of the cylinder. The total capacitance C' of a length L is equal to C*L. A typical capacitance value for automotive filtering applications is between 1000 pf and 3000 pf. The equation can be expressed in another form for a total capacitance C' of 1000 pf:

$$\ln(R_2/R_1) = \frac{2\pi 0885 \epsilon_r}{C'/L} = 0.000556 * \epsilon_r * L$$

The thickness of the dielectric layer ($R_2$–$R_1$) and the length, L, of the integral capacitors can be determined from the above equation once the material and the capacitance value C' are selected. The thickness is proportional to the deposition time and the ablation rate.

The outer electrode 46 is deposited on the dielectric layer using a number of conventional methods, and the exact structure is not critical. For example, this outer electrode could comprise a nickel layer with an outer tin lead plating. A palladium layer with a tin lead plating could also be employed, but these examples are merely representative of a number of conventional choices.

FIG. 2 shows two capacitive segments formed by the method discussed with reference to FIG. 1. The capacitive segments are spaced apart and each capacitive segment includes a dielectric layer 44 surrounded by an electrode 46. The concentric relationship of the dielectric layer 44 and the electrode 46 relative to each other and to the wire 2 is shown in the cross sectional view of FIG. 3.

After the capacitive segments shown in FIG. 2 are formed on a continuous wire or filamentary substrate 2, individual terminals 48 can be formed by severing the continuous wire and forming the individual sections. For example, FIG. 4 shows a right angle pin terminal 48 that is fabricated from a single wire section. Note that the right angle terminal can be formed by conventional means, either before or after the individual sections are severed from the continuous wire. This right angle terminal 48 has a capacitive filter section 50 located at a section 52 intermediate the ends of the terminal 48. The dielectric layer 44 and the outer electrode 46 are fabricated by the method discussed with reference to FIG. 1. A contact section 56, intended to form a separable contact with a mating terminal, not shown, is located at one end of the right angle terminal. A solder section 54 to be soldered in a plated through hole of a printed circuit board 58 is located on the other side of the central terminal section 52. The contact section 56 and the solder section 54 are intended to form input and output contacts with the remainder of the circuit of which terminal pin 48 forms a part. A ground contact 60 establishes a resilient contact with the outer electrode 46. This ground contact 60 is connected to a ground member, such as a shield (not shown). The integral capacitor 50 therefore establishes a filtering capacitance between the terminal pin 48 and a ground member. Since the dielectric is deposited directly on the intermediate section 52 of the terminal pin 48, there is no need for a separate inner electrode since the surface of this pin serves as the inner electrode. Ground contact pin 60 can employ resilient tines to establish contact with the outer electrode 46. Alternatively, the ground pin 60 can be soldered to the outer electrode 46 or other contact means can be employed.

Except for the addition of the integral capacitor 50, the terminal 48 is intended to be conventional in nature. Therefore the contact section 56 would typically employ a conventional plating used on separable contact sections of terminal pins of this type. For example, contact section 56 could employ a selective gold over nickel plating. Solder termination section 54 would likewise employ a typical plating such as tin lead solder plating. These sections would be conventionally plated, for example, by using conventional electroplating methods. The wire 2 would typically be plated prior to deposition of the dielectric layer 44 and the outer electrode 46, since these plating processes are conventional in nature and a better manufacturing quality would be expected of these conventional processes. In some applications, a barrier layer could be plated on the portion of the wire 24 on which the dielectric is to be deposited. A barrier layer could improve the surface character of the wire substrate and promote improved adherence of the dielectric layer 44 to the wire substrate. Alternatively, portions of the terminals could be plated after deposition of the dielectric layer 44 and the outer electrode 46. This alternative sequence would allow the use of conventional dip plating processes on discrete terminals after the terminals have been severed from a continuous substrate.

Although the preferred embodiment of this invention employs a round contact pin with a concentric dielectric layer 44 and a concentric outer electrode encircling the terminal pin, other configurations can also be employed. FIG. 5 shows an alternate embodiment using a terminal pin 148 having a square cross section. Square pins of this type are commonly used in pin header electrical connectors. In this embodiment planar integral capacitors 150 are formed on opposite faces of the square pin 148. Although the dielectric layer 144 and the outer electrode 146 are flat, they still form an integral capacitor on the terminal pin 148. If a wire of square cross section is substituted for the round wire 2 in FIG. 1, there will be no need to rotate the square wire during ablation and annealing. Integral capacitors are formed on opposite sides because conventional contacts used between the terminal pin 148 and ground will preferably engage the opposite sides of the square terminal pin 148.

A third embodiment employing an integral capacitor 250 is shown in FIG. 6. In this embodiment, the integral capacitor 250, including dielectric layer 244 and outer electrode 246, is deposited on a ground member, such as a shield 262. Although a number of conventional interconnections can be employed, a representative spring contact 256 extends between the ground member 262 and the terminal pin 268 and this integral capacitive filter can be electrically indistinguishable from an integral filter formed on a contact pin. This embodiment has the advantage of providing more surface area on which the integral capacitor can be formed.

The representative embodiments and methods depicted herein disclose several ways in which the invention disclosed and claimed herein can be implemented, e.g., by the method disclosed in U.S. Pat. No. 5,155,325 and U.S. Pat. No. 5,049,405 which are incorporated by reference herein. These embodiments do not however disclose all of the uses of this invention. For example, the method of fabricating the integral capacitor and the terminals including the integral capacitor depicts a continuous process. Although manufacturing efficiencies are realizable with a continuous process, discrete terminals on a bandolier carrier strip or a batch process are also ways of implementing this invention. Individual steps in this process need not be carried out at the same time. Realistically, those process steps using a laser or lasers could be carried out on a sequential basis and other steps, such as plating and formation of the outer electrodes could be carried out separately.

This invention is also not limited to use in fabricating terminal pins. For example blade or leaf contacts could be fabricated in this manner. Contacts stamped and formed and carried side by side on a carrier strip would also be suitable for use with this invention. Discrete terminals could also be employed.

This invention is also not limited to the fabrication of a single layer capacitor. Integral multilayer capacitors could also be formed by sequential, repetitive deposition and electrode fabrication steps according to the present invention.

The preferred method of depositing the dielectric layer of the integral capacitor is laser ablation as described herein. However, at least the broader aspects of this invention can be implemented using conventional techniques for depositing a thin layer on a substrate. Physical vapor deposition, including evaporation and sputtering can be employed in applications where high performance may not be needed, but laser ablation is believed to result in a better product and is believed to be a more desirable manufacturing process. This invention is not therefore limited to the representative embodiments disclosed herein, but is instead defined for the following claims.

I claim:

1. A method of fabricating an electrical connector comprising the steps of
   forming an integral capacitive member on a first electrically conductive member by:
   first depositing a dielectric layer on a portion of the first electrically conductive member and then;
   depositing an electrode on a surface of the dielectric layer so that the dielectric layer separates the electrode from the first electrically conductive member, and thereafter;
   assembling the first electrically conductive member as a part of the electrical connector; and
   electrically connecting the electrode on the first electrically conductive member with a second electrically conductive member.

2. The method of claim 1 wherein the first electrically conductive member comprises a terminal.

3. The method of claim 2 wherein the dielectric layer and the electrode are deposited between an input contact section and an output contact section on the terminal.

4. The method of claim 3 wherein the input contact section and the output contact section are plated.

5. The method of claim 3 wherein the dielectric layer and the electrode are deposited in encircling relationship to the terminal.

6. The method of claim 3 wherein the second electrically conductive member comprises a ground member forming a part of the electrical connector.

7. The method of claim 2 wherein the electrical connector includes a plurality of terminals, only those terminals adversely affected by electromagnetic interference having an integral capacitive member thereon.

8. The method of claim 1 wherein the dielectric layer is deposited on the first electrically conductive member by laser deposition.

9. The method of claim 8 wherein the dielectric layer is deposited on the first electrically conductive member by laser ablation.

10. The method of claim 1 wherein the first electrically conductive member comprises a grounding shield surrounding at least a portion of the electrical connector and the second electrical conductive member comprises a terminal positioned in the electrical connector.

11. A method of forming an integral capacitor on an electrical contact terminal formed of an electrically conductive metal comprising the steps of:
    positioning a source containing a layer of dielectric material between a laser and a substrate formed of the electrically conductive metal;
    energizing the laser to cause the dielectric material to be removed from the source and deposited as a dielectric layer on the substrate; and
    forming an electrode on the dielectric layer so that the dielectric layer separates the electrode from the substrate; and
    forming the terminal from the substrate.

12. The method of claim 11 wherein laser ablation is used to remove the dielectric material from the source and deposit the dielectric layer on the substrate.

13. The method of claim 11 comprising the further step of exposing the dielectric layer to a second laser to anneal at least the outer portion of the dielectric layer before forming the electrode.

14. The method of claim 11 comprising the further step of cleaning the surface of the substrate prior to depositing the dielectric layer thereon.

15. The method of claim 11 wherein the dielectric layer is deposited on only a portion of the substrate to be used to form the terminal so that the terminal includes other sections for forming electrical input and output contacts.

16. The method of claim 11 wherein the substrate comprises a filament and dielectric layers are sequentially formed on spaced segments of the filament.

17. The method of claim 16 wherein the filament comprises a wire, the dielectric layer being deposited on the wire by relative rotation between the wire and the source during deposition of the dielectric layer.

18. The method of claim 16 wherein the filament is moved relative to the source to position spaced segments of the filament relative to the source so that successive laser pulses are used to deposit dielectric layers on the spaced segments only.

19. The method of claim 11 wherein the terminal is formed from the substrate either before or after the dielectric layer is deposited on the substrate and the terminal is formed either before or after the electrode is deposited on the dielectric layer.

20. The method of claim 11 wherein the substrate is first advanced through a cleaning station to remove contaminants from segments of the substrate on which integral capacitors are to be formed, the substrate then being advanced to a laser ablation station where laser pulses form the dielectric layer on the segments, the substrate next being advanced to a laser annealing station wherein a laser pulse anneals at least the outer portion of the dielectric layer, wherein the outer electrode is deposited and the terminal is formed from the substrate after the annealing stage.

21. The method of claim 11 wherein the dielectric layer is deposited on the substrate at a temperature below a temperature that would cause metallurgical alteration to the substrate.

22. The method of claim 11 wherein the dielectric layer is additively deposited so that the thickness of the dielectric layer is determined by the time of exposure to the laser.

23. The method of claim 11 wherein the dielectric layer is additively deposited so that the thickness of the dielectric layer is determined by the deposition rate.

24. The method of claim 11 wherein a pulsed ultraviolet laser is used to deposit the dielectric layer on the substrate.

25. The method of claim 11 wherein an excimer laser is used to deposit the dielectric layer on the substrate.

* * * * *